United States Patent
Dutta et al.

[11] Patent Number: 5,853,888
[45] Date of Patent: Dec. 29, 1998

[54] SURFACE MODIFICATION OF SYNTHETIC DIAMOND FOR PRODUCING ADHERENT THICK AND THIN FILM METALLIZATIONS FOR ELECTRONIC PACKAGING

[75] Inventors: Indranath Dutta, Marina; Sarath K. Menon, Monterey, both of Calif.

[73] Assignee: The United States of America as represented by the Secretary of the Navy, Washington, D.C.

[21] Appl. No.: 845,581

[22] Filed: Apr. 25, 1997

[51] Int. Cl.$^6$ ................................................. B32B 18/00
[52] U.S. Cl. ..................... 428/408; 428/457; 428/469; 428/472; 428/698; 428/701; 428/702; 204/192.38; 427/534; 427/542; 427/96; 427/99; 427/249; 427/309; 427/314; 427/350; 427/372.2; 427/380; 427/419.2
[58] Field of Search ................................ 428/408, 457, 428/469, 472, 698, 701, 702; 204/192.38; 427/534, 542, 96, 99, 249, 309, 314, 350, 372.2, 380, 419.2

[56] References Cited

U.S. PATENT DOCUMENTS

| | | | |
|---|---|---|---|
| 5,024,680 | 6/1991 | Chen et al. | 51/295 |
| 5,126,207 | 6/1992 | Chen et al. | 428/408 |
| 5,392,982 | 2/1995 | Li | 228/124.5 |
| 5,587,233 | 12/1996 | Konig et al. | 428/698 |

FOREIGN PATENT DOCUMENTS 0 257 439  3/1988  European Pat. Off. .

*Primary Examiner*—A. A. Turner
*Attorney, Agent, or Firm*—Donald E. Lincoln; Frank G. Niemann

[57] ABSTRACT

An article and a method of making surface modified synthetic diamond substrates at temperatures below 500° C. for electronic packaging applications are described. The article consists of a synthetic diamond substrate, the surface of which has been modified by providing an adherent thin coating of a ceramic (alumina) material so as to enable metallization of synthetic diamond by current industrial methods. The method of surface modification comprises deposition of a thin transition metal layer on the synthetic diamond substrate prior to low temperature reactive vapor deposition of aluminum followed by annealing in an oxygen atmosphere.

2 Claims, 8 Drawing Sheets

5,853,888

SURFACE MODIFICATION OF SYNTHETIC DIAMOND FOR PRODUCING ADHERENT THICK AND THIN FILM METALLIZATIONS FOR ELECTRONIC PACKAGING

BACKGROUND OF THE INVENTION

1. Field of the Invention

This invention relates to electronic packaging applications. More precisely this invention relates to metallization of synthetic diamond substrates for electronic packaging applications. Specifically, this invention involves modifying the surface of synthetic diamond in order to enhance the adhesion of metallization to synthetic diamond substrates for electronic packaging applications.

2. Description of the Related Art

Synthetic (e.g., chemically vapor deposited (CVD)) diamond offers substantial advantages over conventional electronics packaging materials because of its superior thermal properties. Specifically, it has one of the highest thermal conductivities of all materials known to man. This prevents electronic devices enclosed in the package from being unduly heated during operation. In such applications, the diamond substrate has to be metallized, either to form solder die attaches or to form electrically conductive interconnections between various devices that are contained in the package. However, typical conductive metallizations, such as gold (Au), copper (Cu) and aluminum (Al), display very poor adhesion to diamond, thereby causing problems associated with the reliability and stability of metallized diamond packages.

To address this problem, several processes have been proposed, such as U.S. Pat. No. 4,664,991 issued to D. S. Park in 1967; C. D. Iacovangelo and E. C. Jerabek, "Metallizing CVD Diamond for Electronic Substrates", Proc. Intl. Symp. Micoroelectronics, Dallas, Tex., 1993, 132–137; C. D. Iacovengelo, P. J. DiConza, E. C. Jerabek, K. P. Zarnoch, "Metallizing and Die Attaching to CVD Diamond", Proc. MRS Symp., Vol 337, 1994, 401–412. All these processes involve the application of a transition metal layer, such as titanium (Ti), tungsten (W), chromium (Cr) or niobium (Nb), either as the final metallization, or as an inter-layer between the final metallization and CVD diamond. A variety of techniques have been utilized for this purpose, including high temperature CVD ( U.S. Pat. No. 4,664,991), sputtering ("Metallizing CVD Diamond for Electronic Substrates"), low pressure CVD ("Metallizing CVD Diamond for Electronic Substrates" and "Metallizing and Die Attaching to CVD Diamond") and electroless plating ("Metallizing CVD Diamond for Electronic Substrates" and "Metallizing and Die Attaching to CVD Diamond"). Metallizations comprising alloyed transition metals (e.g., WTi) and a combination of a transition metal with a platinum diffusion barrier (e.g., Ti/Pt) have also been used ("Metallizing CVD Diamond for Electronic Substrates" and "Metallizing and Die Attaching to CVD Diamond"). In all cases, the transition metal layer bonds with diamond via carbide formation at the interface. Where necessary, a conductive metallization (typically Au) is subsequently applied on the transition metal layer to form the interconnection circuitry via a thin film deposition process or electroless plating ("Metallizing CVD Diamond for Electronic Substrates" and "Metallizing and Die Attaching to CVD Diamond"), and adheres to the inter-layer via metallic bonding.

A number of U.S. patents have been awarded recently for metallization processes using the general approach discussed above. In U.S. Pat. No. 5,328,715, Iacovangelo et al., have metallized via-holes in CVD substrates by low pressure CVD (LPCVD) of a refractory metal (tungsten) at 300°–900° C. and 0.1 to 3.0 Torr, wherein the tungsten-layer adhered to CVD diamond by interfacial carbide formation. In U.S. Pat. No. 5,334,306, Dautremont-Smith et al, produced metallized paths on a CVD diamond substrate surface by laser-scribing or ion-beam implanting a graphite path on the substrate surface, followed by electroplating a layer of titanium which bonds to graphite by carbide formation, and subsequently vapor depositing a final metallization of tungsten or nickel. In U.S. Pat. No. 5,346,719, Zarnoch and Iacovangelo produced tungsten metallizations on CVD diamond by LPCVD of a very thin layer of tungsten, followed by heat treating to produce a refractory metal-carbon bonding layer which strengthened the interfacial adhesion, followed by continued deposition of tungsten. In U.S. Pat. No. 5,382,758, Iacovangelo et al. produced metallized vias in diamond substrates by laser ablating a through-hole in the diamond substrate, removing the residual graphite from the hole surface and depositing tungsten in the hole by LPCVD at 300°–900° C., causing the tungsten to bond to diamond via tungsten carbide formation.

All the above approaches require the application of a metal (e.g., W. Mo, Nb etc.) which is carbide forming, but is less electrically conductive than Au or Cu, as either the final metallization or as an inter-layer between Au or Cu and diamond. This either produces a metallization with less than ideal electrical properties, or requires that the inter-layer be patterned identically to the overlying interconnection circuitry, since a continuous metallic inter-layer between the diamond and the final metallization would short out the circuitry. This requirement for patterning the inter-layer complicates the metallization process substantially, and in practice, restricts the use of such approaches to thin film/lithographic metallization techniques, making it unsuitable for thick paste processes. Since thick film metallization via screen printing of fritted pastes is currently one of the most common techniques used in electronics packaging, there is a strong need for the development of metallization approaches for synthetic diamond substrates that do not require patterning of inter-layers.

SUMMARY OF THE INVENTION

This invention comprises a new approach for metallizing synthetic diamond substrates for electronic applications. The invention was conceived with the aims of solving three problems associated with metallizing diamond (i.e., coating the diamond with conductive metal circuitry): (1) the poor adhesion of common interconnection materials (e.g., gold, copper or aluminum) to the substrate when deposited directly on diamond; (2) the need to pattern any adhesion-enhancing inter-layer identically to the interconnection material in the case when the inter-layer is metallic; and (3) the difficulties associated with thick film metallization of diamond by commercially available fritted pastes.

The surface treatment described in this disclosure is unique and differs significantly from the current metallization approaches in that it obviates the necessity of a patterned metallic inter-layer. Once treated using the technique of this invention, the diamond substrate becomes amenable to both thin and thick film metallization by conductive metals like Au or Cu using conventional approaches. It is, therefore, an object of this surface modification invention to render the diamond substrate amenable to both thin and thick film metallization using existing approaches and materials which are currently in use industry-wide for alumina-based electronic packages. An advantage is that this surface modification allows existing metallizations currently in use for alumina packaging to be used on diamond.

A further objective of this surface modification approach is to produce a very thin, well-adherent, continuous layer of alumina on diamond.

The choice of alumina as a surface layer to render diamond metallizable was based on the following requirements:

1. the layer must be electrically insulating so as to prevent shorting of surface interconnections (electrical resistivity $\geq 10^8$ Ω-cm);
2. the layer must have a high dielectric strength (i.e., a dielectric constant $\leq 10$) so that interconnections can be closely packed on the substrate surface without shorting out;
3. the coefficient of thermal expansion of the layer must be intermediate between those of diamond (~$1.5 \times 10^{-6}$/K) and the final metallization (~$15$–$25 \times 10^{-6}$/K) so as to reduce interfacial residual stresses and thereby enhance package reliability;
4. the layer must be chemically stable under a wide variety of use environments;
5. the layer must be easily metallizable via existing thin and thick film processes;
   and, most importantly,
6. the layer must not degrade the thermal conductivity (K) of the entire package substantially.

Conditions 1 through 5 are satisfied nicely by alumina, which has an electrical resistivity range of $10^8$–$10^9$ Ω-cm, a dielectric constant of 8.5, a coefficient of thermal expansion of $7 \times 10^{-6}$/K, is extremely stable chemically (free energy of formation at room temperature is ~$-250$ kcal/mole, less than that of most ceramics), and is easily metallizable using currently used techniques. Although it has a low thermal conductivity (~25 W/m-K), condition 6 can be satisfied by making the alumina layer very thin (~1000 Å). For instance, a simple one-dimensional heat transfer calculation reveals that the through-thickness thermal conductivity of a 200 micrometers ($\mu$m) thick diamond of K=1500 W/m-K drops by less than 3% on being coated with a 1000 Å thick layer of alumina.

The above objectives are achieved as follows.

First, referring to FIG. 1, a 100–500 angstrom (Å) thick layer of a carbide forming transition metal 15 is deposited on a clean CVD diamond substrate 10. Then, a 500–1500 Å thick layer of alumina ($Al_2O_3$) 20 is deposited on the transition metal layer 15. Following this, the CVD diamond substrate 10 (coated with the transition metal 15 and $Al_2O_3$ 20) is annealed at 300° to 500° C. for 18 to 48 hours in pure oxygen. This produces a metal-carbide layer 25 between the CVD diamond substrate 10 and the carbide forming transition metal 15, and an interdiffusion zone 30 between the carbide forming transition metal 15 and the alumina layer 20.

The $\gamma$-$Al_2O_3$ layer 20 produced on the surface is electrically insulating (resistivity>$10^6$ Ω-cm). The film is strongly adherent to the diamond substrate, as evidenced by our inability to strip the film off from the substrate using acetate replicating and packaging tapes. The film was also found to be very stable and robust, and did not crack, scratch or peel off during normal handling following deposition. The $Al_2O_3$ film so produced is amenable to both thin and thick film metallization using techniques currently in use industry-wide, and completely circumvents the need for producing patterned transition metal inter-layers prior to the deposition of the conductive interconnection metallization. The final conductive metallization 35 is shown in FIG. 1.

Figure 1:
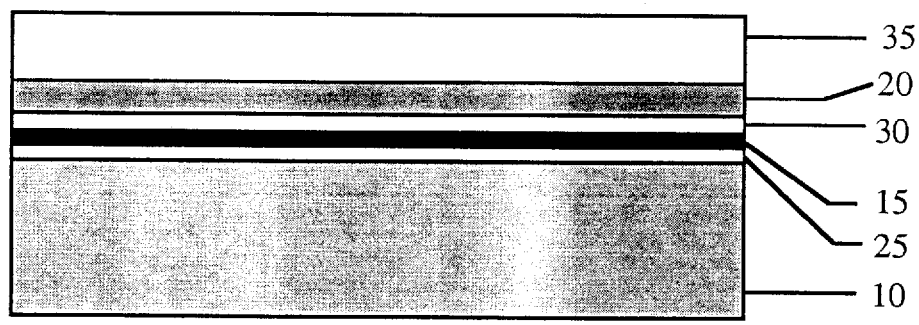
FIG. 1 is a schematic of the various layers which constitute the proposed surface modification technique for CVD diamond.

IN THE DRAWINGS THE FOLLOWING DESIGNATIONS ARE USED:

Layer 10=CVD Diamond;
layer 15=carbide forming transition metal;
layer 20=alumina layer;
layer 25=metal-carbide formed by reaction between layers 10 and 15;
layer 30=interdiffusion zone between layers 15 and 20;
layer 35=final metallization.

DESCRIPTION OF THE INVENTION

As discussed earlier, diamond is an excellent substrate material for electronic packaging because of its high electrical resistivity, excellent thermal conductivity, and low dielectric constant. However, diamond is difficult to metallize because of two reasons: (1) the surface of diamond is relatively inert, making it difficult for highly conductive, but non carbide-forming, metallizations like gold (Au) or copper (Cu) to adhere to it; and (2) its thermal expansion coefficient is very small (~$1$–$2 \times 10^{-6}$/K), resulting in large interfacial residual stresses between the substrate and the metallization. As a result, traditional approaches to metallize diamond have utilized less electrically conductive, but carbide-forming metals like tungsten (W), molybdenum (Mo), niobium (Nb), with smaller thermal expansion mismatch with diamond than Au or Cu, as either (1) the final metallization, or (2) as an interlayer between Au or Cu metallizations and diamond. The first approach results in a metallization with less than ideal electrical properties, whereas the second approach requires the inter-layer to be patterned identically to the final metallization, which in practice precludes this approach from being used for conventional thick film processes. This invention circumvents these limitations by producing a very thin, well bonded layer of an electrically insulating material (alumina) of good dielectric strength on the diamond substrate, such that the thermal conductivity of the treated substrate is not degraded significantly ($\leq 5\%$). This allows the treated diamond surface to be metallized using all conventional thin and thick film processes currently in use industry-wide for alumina packages.

EXPERIMENTAL

The essential steps in this invention consist of the following: (references to FIG. 1)

1. Producing a very thin ($\leq 500$ Å) layer of a carbide-forming transition metal 15 (e.g., chromium, tungsten, molybdenum, titanium, tantalum or niobium) on the surface of a CVD diamond substrate 10 via any physical or chemical vapor deposition or wet chemistry route. In the inventors' laboratory, this was achieved by deposition of thermally evaporated Cr at the rate of 100 Å/minute at a base vacuum of $10^{-7}$ Torr. During deposition, the substrate was heated to 250°–500° C. to result in a limited degree of incipient metal-carbide formation 25.

2. Depositing a thin (500–2000 Å) layer of alumina 20 on the metal coating 15, while keeping the substrate 10 heated to 250°–500° C. This can be achieved by any number of physical or chemical vapor deposition routes, or via wet chemistry approaches (e.g., sol-gel processing). In the inventors' laboratory, alumina 20 deposition was achieved by reactive evaporation of aluminum (Al) in a vacuum chamber backfilled to a pressure of about $10^{-5}$ Torr with 99.99% pure oxygen. During deposition, the substrate 10 was heated to a temperature of 300° to 500° C., and the deposition rate was 10–40 Å/minute. It is important that the temperature during deposition is maintained below 500° C. so as to prevent degradation of the diamond substrate due to oxidation. Although alumina films have been produced by negative evaporation earlier [R. F. Bunshah and R. J. Schramm, Thin Solid Films, 40, 1977, pp. 211–216, "Alumina Deposited by Activated Reactive Evaporation"], the method of the present invention is distinctly different from previous processes in that it produces a crystalline alumina film at temperatures substantially lower than the lowest temperatures previously reported (i.e., 700°–800° C.) [See reference above.]

3. Heat treating the CVD diamond substrate 10 with the overlying metal 15 and alumina layers 20 for 18–48 hours in a pure oxygen atmosphere at 300°–500° C. In the inventors' laboratory, the heat treatment comprised holding the coated substrate 10 for ~24 hours at 350°–400° C. after backfilling the deposition chamber with 99.99% pure oxygen to a pressure of about 1 to 500 Torr, resulting in an oxygen partial pressure of nearly 1. The purpose of this heat treatment is fourfold: (i) to make the transition metal 15 to diffuse into and react with the underlying diamond substrate 10 to form a metal-carbide layer 25 at the interface, thereby providing strong adhesion at the metal-diamond interface via chemical bonding between metal and carbon; (ii) to create an inter-diffusion zone 30 between the transition metal 15 and alumina 20, causing the metal to adhere strongly to alumina; (iii) to anneal out defects from, and homogenize the through thickness composition of, the alumina layer; and (iv) to increase the electrical resistivity of the alumina layer.

The structure and chemistry of the surface layers produced on CVD diamond substrates by the above method were characterized in detail, and the results are summarized below.

Figure 2:
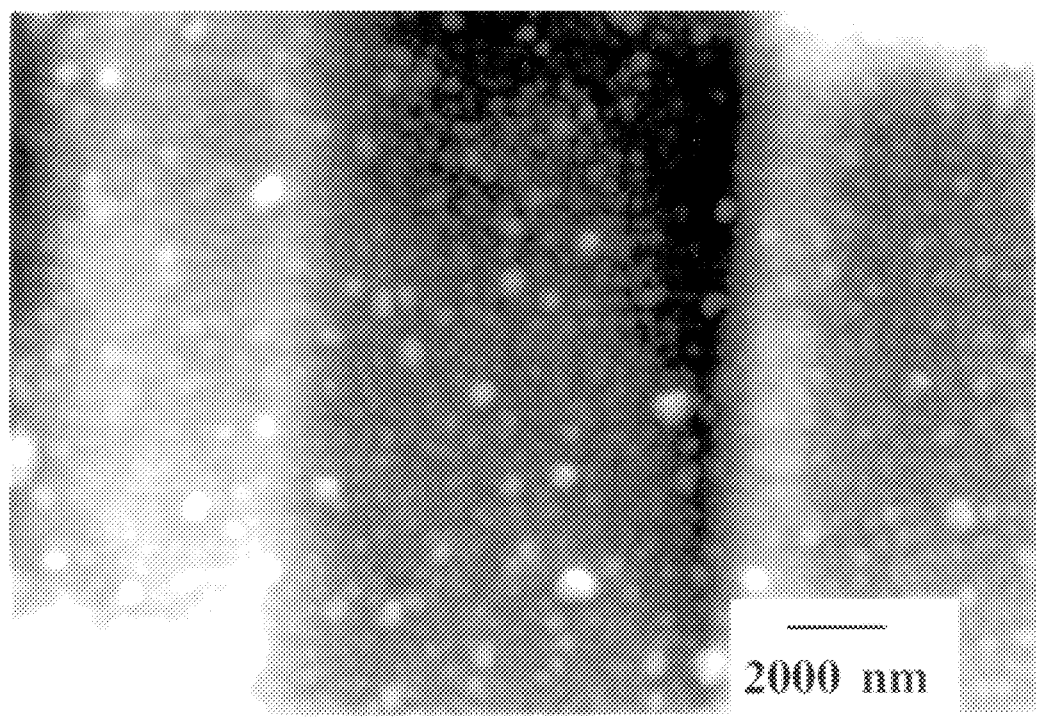
FIG. 2 is a scanning electron micrograph (SEM) showing the appearance of a 1000 Å thick surface alumina layer produced on a CVD diamond substrate with a 300 Å thick Cr inter-layer.
Figure 3:
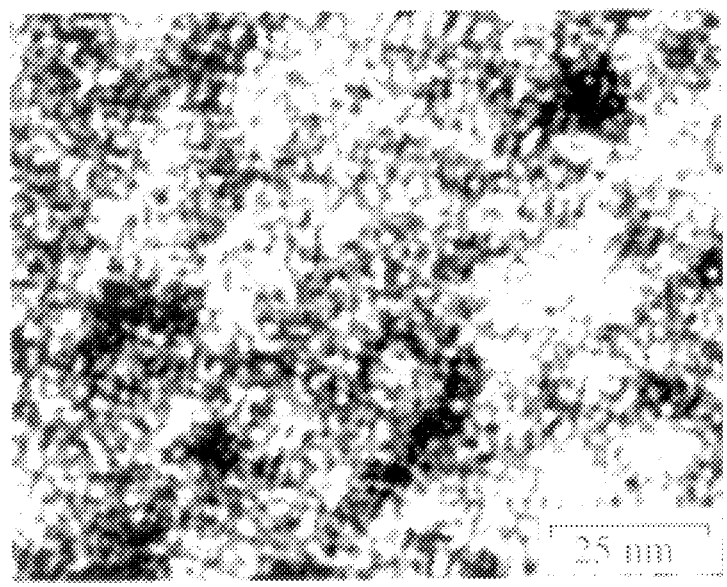
FIG. 3(a) is a bright field transmission electron micrograph (TEM) of the alumina film deposited on a 200 Å Cr interlayer.
FIG. 3(b) is the corresponding selected area diffraction pattern (SADP) of the alumina deposited on a 200 Å Cr interlayer, showing that the film consists of ultrafine (30–100 Å) $\gamma$-alumina crystallites.
Figure 3:
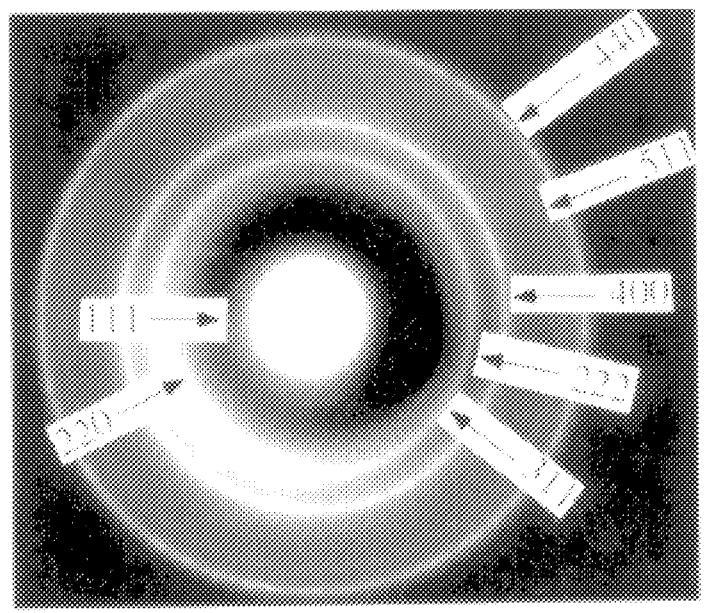

FIG. 2 shows the appearance of the surface alumina layer produced on a Cr coated CVD diamond film on silicon using the above technique. A range of $Al_2O_3$ crystallite sizes is observed, with the largest surface crystallite size being about 0.2–0.3 μm. FIG. 3(a) shows a bright field transmission electron micrograph (TEM) of the alumina film deposited on the Cr interlayer. The corresponding selected area diffraction pattern (SADP) is shown in FIG. 3(b). It is observed that the film is nanocrystalline in character, with the crystallite size ranging from 3 to 10 nanometers (nm). The sharp, somewhat spotty, rings in the SADP confirm that the film is largely crystalline, with negligible amorphous component. The rings in the SADP correspond exactly to reflections from $\gamma$-$Al_2O_3$ (JCPDS card#10–425, Int'l. Center for Diffraction Data, PA, 1990), and were indexed as shown in FIG. 3(b).

Figure 4A:
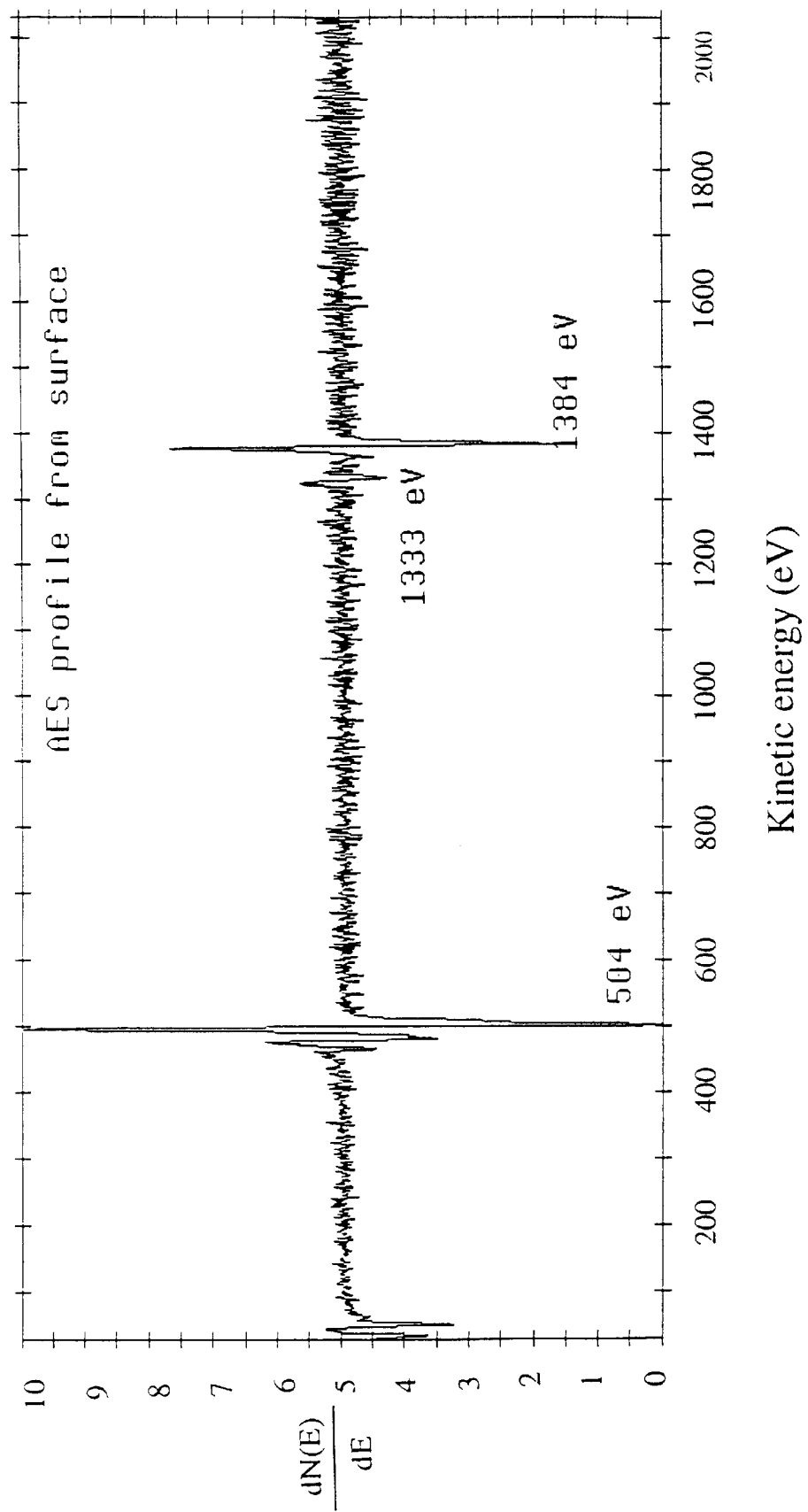
FIG. 4(a) is an Auger electron spectrum from the surface of the $\gamma$-$Al_2O_3$ film deposited on CVD diamond with a Cr inter-layer.
Figure 4B:
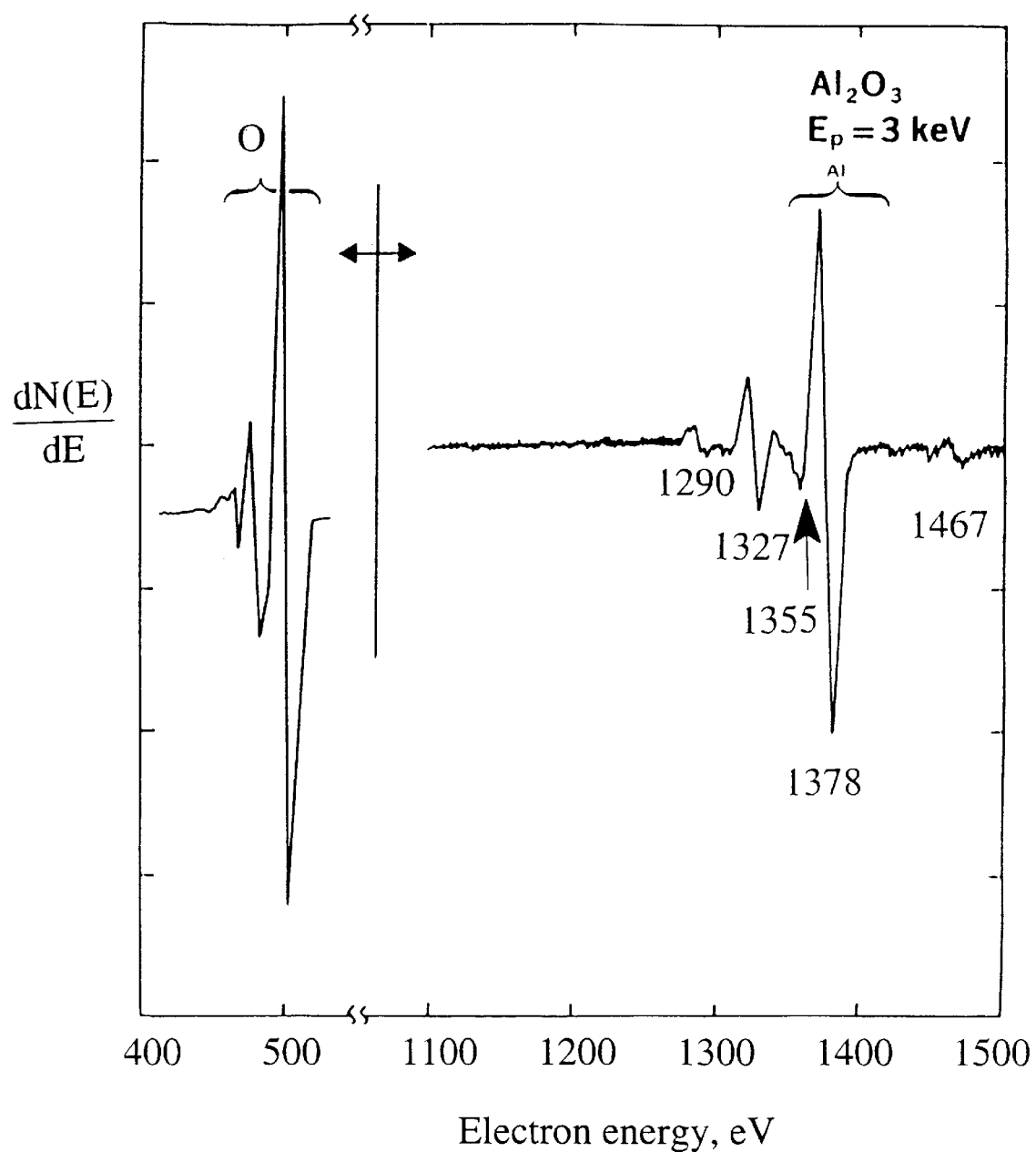
FIG. 4(b) is an Auger electron spectrum from pure $Al_2O_3$. L. E. Davis, N. C. MacDonald, P. W. Palmberg, G. E. Riach and R. E. Weber, Handbook of Auger Electron Spectroscopy (Physical Electronics, 1976).
Figure 4C:
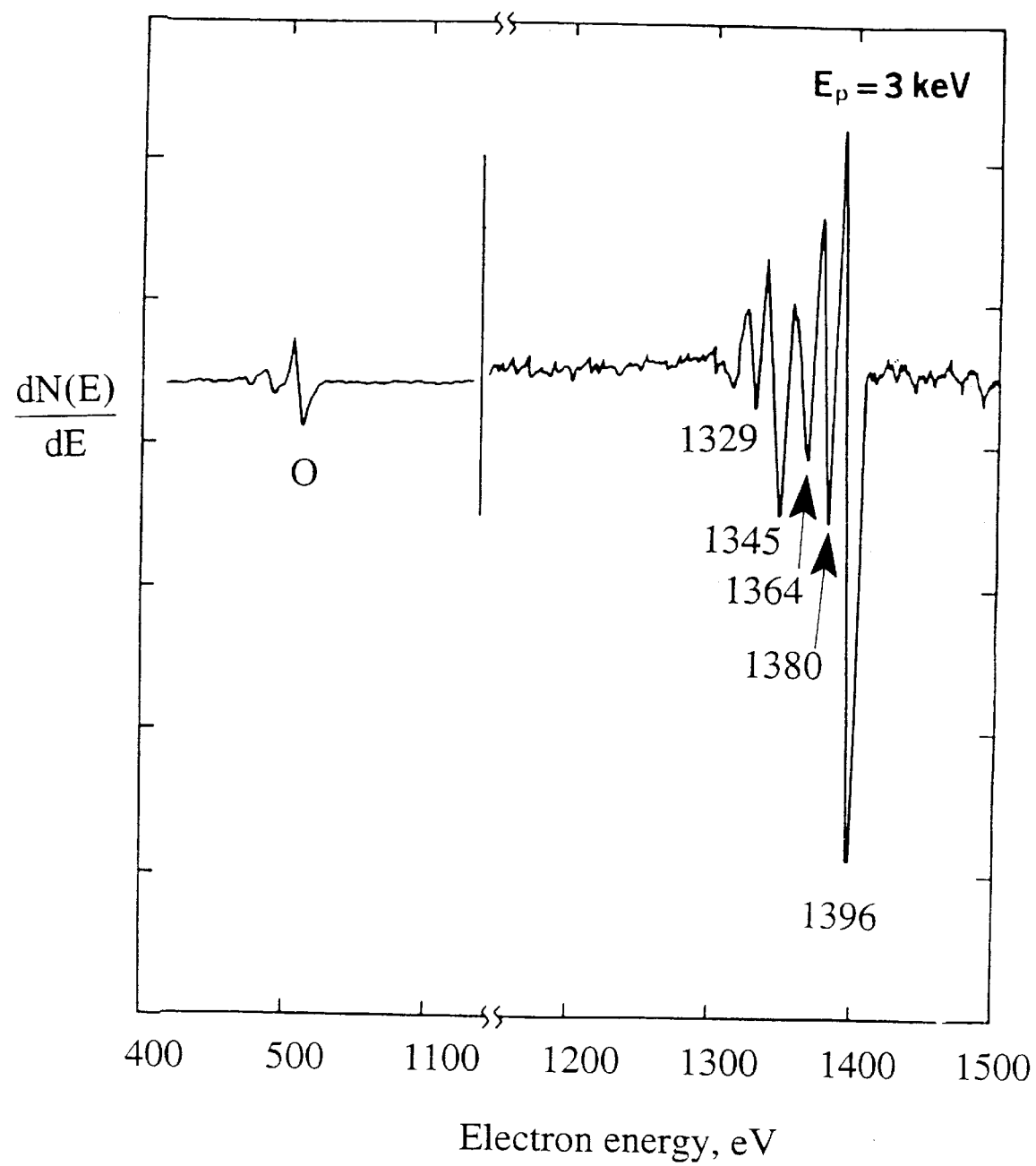
FIG. 4(c) is an Auger electron spectrum from unreacted aluminum. (See "Handbook" above).

Based on the above, it is clear that the present technique produces a thin (~1000 Å), nanocrystalline film of $\gamma$-$Al_2O_3$ on the 200–400 Å thick Cr inter-layer that was deposited on CVD diamond. During heat treatment, some of the surface crystallites grew rapidly via surface diffusion, causing the surface grain size to be significantly larger (FIG. 2), although the underlying layer was nanocrystalline. FIG. 4(a), which is an Auger electron spectrum (AES) from the surface of the film deposited on CVD diamond with a Cr inter-layer, clearly shows two peaks-one corresponding to oxygen at 504 eV, and the other corresponding to aluminum at 1384 eV. The detailed structure of the aluminum peak reveals that it is identical to that from pure $Al_2O_3$, shown in FIG. 4(b), and is distinctly different from that of unreacted aluminum (FIG. 4(c)). AES spectra obtained after removing several atomic layers of the materials also showed peaks corresponding to $Al_2O_3$ only. This suggests that little or no unreacted aluminum is left in the film, and it is entirely $\gamma$-$Al_2O_3$.

Figure 5:
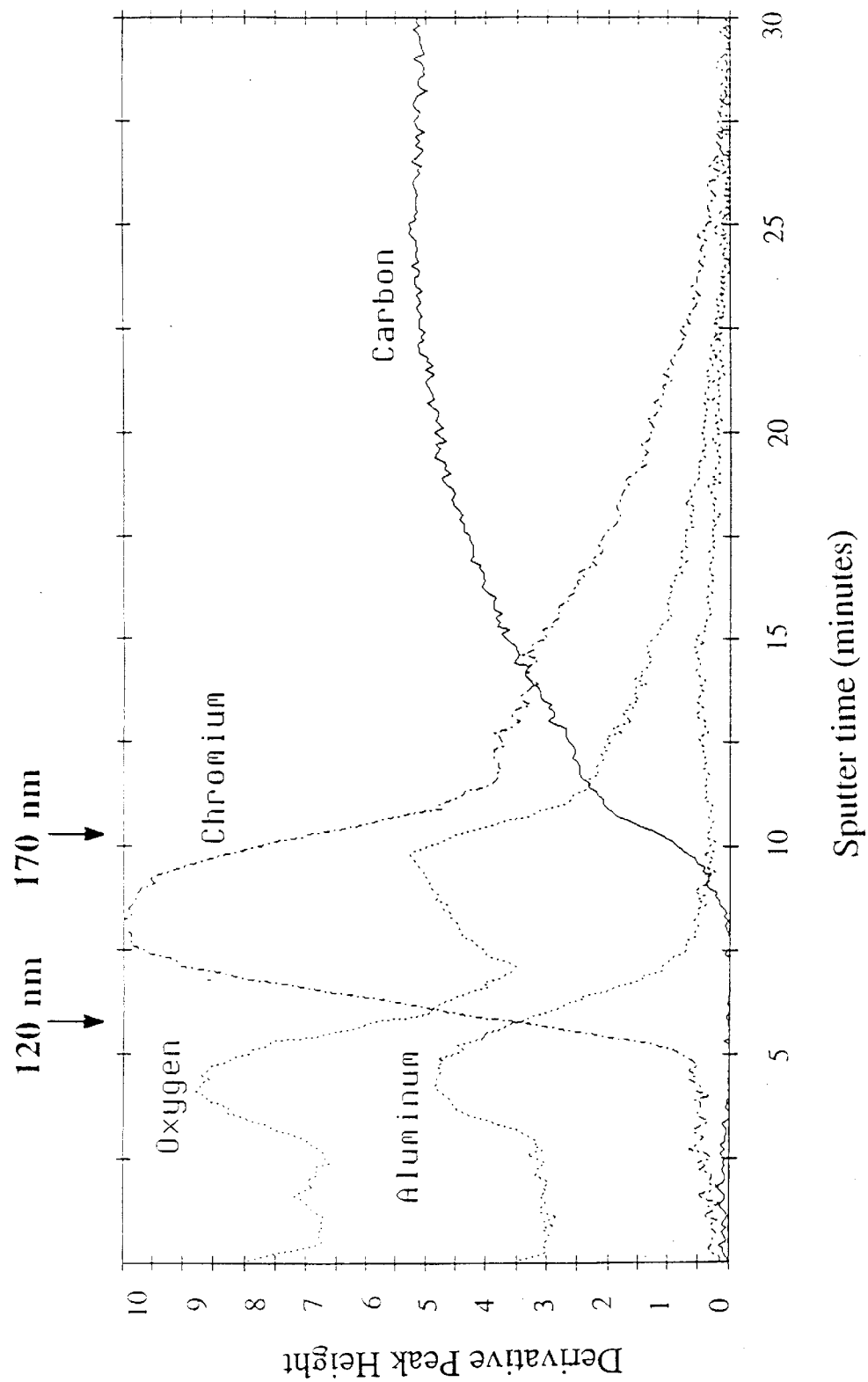
FIG. 5 is an Auger electron depth profile through a ~1000 Å alumina film deposited on a 400 Å Cr inter-layer on a CVD diamond substrate. All the zones (10 through 35) indicated schematically in FIG. 1 are observed clearly.

FIG. 5 shows an Auger depth profile through an alumina film deposited on a Cr inter-layer on a CVD diamond substrate. Till about 1000 Å from the surface (sputter time of ~5 minutes), only oxygen and aluminum signals are observed, in agreement with the TEM analysis which showed the entire surface layer (20 in FIG. 1) to be $\gamma$-$Al_2O_3$. The next zone constitutes the Cr inter-layer, and extends for about 400 Å (15 in FIG. 1). It is observed that there is significant interdiffusion between Cr and aluminum and oxygen from the $Al_2O_3$ layer. The interdiffusion zone (30 in FIG. 1) ranges over a sputter time of 5 to 8 minutes. This interdiffusion zone results in strong chemical bonding between Cr and the overlying $Al_2O_3$, and is responsible for the excellent adhesion between these two layers. A point of further interest is the extended region ranging over a sputter time of ~12–25 minutes, in which Cr and C from the underlying CVD diamond have interdiffused and reacted to form Cr-carbide (25 in FIG. 1). That this region represents not merely interdiffusion of Cr and C, but a reaction between them, is evidenced from the shape of the Cr peak in this region. Instead of the Cr signal decreasing smoothly from its peak at a sputter time of 8 minutes, as would be expected if only interdiffusion had occured, a hump is observed in the Cr and C signals between 12 and 18 minutes, suggesting a chemical reaction in addition to interdiffusion. This combination of reaction and interdiffusion results in strong adhesion between the Cr inter-layer and the diamond substrate.

Thus, the above surface treatment yields a very thin, ultra-fine grained, adherent alumina surface layer which is chemically bonded to a chromium inter-layer, which in turn is chemically bonded with the underlying CVD diamond substrate. Since the surface layer is alumina, which is widely used as a substrate material for electronic packaging, the CVD diamond substrate, treated as above, is easily metallizable by a number of thin and thick film techniques, using existing materials and procedures developed for alumina.

The present inventive surface modification has the following advantages over other approaches to metallization of diamond substrates:

a. It renders the diamond substrate metallizable by standard methods and metallization materials developed for alumina, which is widely used in the electronic packaging industry at present. For instance, fritted pastes of highly conductive metals like Au or Cu, currently in use for alumina substrates, can be directly applied to CVD diamond treated in the proposed manner.

b. The approach is applicable to both thin and thick film metallization.

c. It eliminates the necessity of using transition or refractory metals (e.g., W, Nb, Ti, Mo, etc.), which do not possess very high electrical conductivity, as the final conductive metallization.

d. It obviates the necessity of patterning a transition or refractory metal inter-layer between the over-lying conductive interconnection pattern and the under-lying diamond substrate, thereby allowing substantial simplification of the metallization process.

e. It results in negligible degradation (<5%) in the thermal conductivity of the substrate, since the surface alumina layer is very thin. The substrate treated in the proposed manner has a thermal conductivity which is very close to that of the diamond substrate.

f. Since alumina has a coefficient of thermal expansion (CTE) which is intermediate between those of diamond ($1-2\times10^{-6}$/K) and most metals ($\sim10-25\times10^{-6}$/K), it reduces interfacial residual stresses between the metallization and substrate, and is therefore expected to improve metallization reliability.

g. Since the alumina coating and the metallic inter-layer are both continuous and of uniform thickness, they may be easily produced on diamond using a number of techniques, including vapor deposition and wet chemistry processes.

h. The continuous metallic layer below alumina may be advantageous in some high frequency (microwave) applications, due to its ability to provide good signal grounding.

i. The stability and robustness of the alumina coating allows good handleability of the treated diamond substrate. Therefore, the proposed treatment has the potential for being integrated with the diamond deposition process as a standard surface modification of synthetic (e.g., CVD) diamond for packaging applications.

j. Finally, the approach offers a scheme to produce well-adherent alternating metal-dielectric planes for use in diamond-based multi-layered electronic packages.

It will be apparent to those skilled in the art that many alternatives and modifications in the present invention are possible in light of the above teaching. Utilizing a surface coating of a different thin film oxide, using different carbide forming metals as inter-layers, use of additional diffusion barrier layers between alumina and diamond, using layer(s) of different thickness(es) and/or structure(s), and variations or modifications of the deposition method and/or parameters are possible alternative approaches to this invention, so long as they are aimed at producing a thin ceramic oxide layer on diamond with a metal or metal-carbide inter-layer. It is, therefore, to be understood that the present invention may be practiced within the scope of the following claims other than as described herein.

What is claimed is:

1. An article of surface modified synthetic diamond for electronic packaging applications, comprising:

a clean diamond substrate;

a layer of a carbide-forming transition metal on the clean diamond substrate;

a thin metal-carbide layer between the transition metal and the diamond substrate to form a chemical bond between the diamond and metal layers;

an adherent crystalline alumina layer deposited on the transition metal layer to serve as a dielectric; and an interdiffusion zone between the transition metal and alumina layers resulting in strong chemical bonding between the alumina and the transition metal layers, so as to make diamond metallizable by conventional thin and thick film techniques, and to decrease the through-thickness thermal conductivity of diamond by less than 5%, whereby the article is capable of being used as a highly thermally conductive metallized diamond substrate for electronic packaging.

2. A method of modifying the surface of diamond substrates at temperatures below 500° C., which comprises:

vacuum-depositing a layer of a carbide-forming transition metal on a clean synthetic (e.g., CVD) diamond substrate while heating the substrate between 250°–500° C. at a pressure of less than $5\times10^{-7}$ torr;

depositing an alumina layer onto the transition metal layer by reactive evaporation of aluminum in a low partial pressure of oxygen (<$5\times10^{-4}$ torr) at a deposition rate of 10 to 40 Å/minute while continuing to heat the substrate between 250°–500° C.; and annealing the coated diamond substrate between 300° and 500° C. at an oxygen partial pressure of 100–600 torr, whereby the reaction between the transition metal and diamond is further enhanced to produce a metal-carbide layer at the interface, an interdiffusion zone is created between the transition metal and alumina, and the as deposited alumina film becomes crystalline and electrically insulating, making the diamond substrate suitable for the production of adherent thick and thin film metallizations for electronic packaging applications.

* * * * *